(12) United States Patent
Najda et al.

(10) Patent No.: US 7,138,285 B2
(45) Date of Patent: Nov. 21, 2006

(54) CONTROL OF CONTACT RESISTANCE IN QUANTUM WELL INTERMIXED DEVICES

(75) Inventors: Stephen Najda, Glasgow (GB); Stewart Duncan McDougall, Hazelbank (GB); Xuefeng Liu, Glasgow (GB)

(73) Assignee: Intense Limited, Glasgow (GB)

( * ) Notice: Subject to any disclaimer, the term of this patent is extended or adjusted under 35 U.S.C. 154(b) by 69 days.

(21) Appl. No.: 10/515,198

(22) PCT Filed: May 21, 2003

(86) PCT No.: PCT/GB03/02186
§ 371 (c)(1),
(2), (4) Date: Nov. 19, 2004

(87) PCT Pub. No.: WO03/100823
PCT Pub. Date: Dec. 4, 2003

(65) Prior Publication Data
US 2006/0057748 A1    Mar. 16, 2006

(30) Foreign Application Priority Data
May 25, 2002    (GB) .................................. 0212072.3

(51) Int. Cl.
*H01L 21/00* (2006.01)
(52) U.S. Cl. .................................. 438/31; 257/E21.089
(58) Field of Classification Search .................. 438/31
See application file for complete search history.

(56) References Cited
U.S. PATENT DOCUMENTS
5,708,674 A * 1/1998 Beernink et al. ........ 372/50.12
5,762,706 A    6/1998 Kikkawa et al.
2003/0071265 A1* 4/2003 Thompson et al. ........... 257/79

FOREIGN PATENT DOCUMENTS
| EP | 0 725 432 A | 8/1996 |
| WO | WO 02/11257 A | 2/2002 |
| WO | WO 02/35589 A | 5/2002 |

OTHER PUBLICATIONS

International Search Report (ISR) on PCT/GB03/02186, issued by the European Patent Office on Jun. 4, 2004.
D. A. Thompson et al., "New Methods of Defect-enhanced Quantum-Well Intermixing And Demonstrated Integrated Distributed-Feedback Laser Modulator", Optoelectronic Materials and Devices II, Taipei, TW, Proceedings of the SPIE—The International Society For Optical Engineering, vol. 4078, Jul. 26-28, 2000, pp. 148-161.

(Continued)

*Primary Examiner*—Asok Kumar Sarkar
(74) *Attorney, Agent, or Firm*—Jefferson Perkins

(57) ABSTRACT

A method of performing quantum well intermixing in a semiconductor device structure uses a sacrificial part of a cap layer, that is removed after QWI processing, to restore the cap surface to a condition in which high performance contacts are still possible. The method includes: a) forming a layered quantum well structure including a doped cap layer; b) forming an etch stop layer over said cap layer; c) forming a sacrificial layer over said etch stop layer, said etch stop layer having a substantially lower etch rate than said sacrificial layer when exposed to predetermined etch conditions; d) carrying out a quantum well intermixing process on the device structure, which process induces significant damage to at least a portion of the sacrificial layer; e) removing the sacrificial layer in at least a contact region of the device using an etch procedure selective against the etch stop layer to expose said etch stop layer in the contact region; and f) forming a contact over the layered quantum well structure in at least said contact region.

14 Claims, 7 Drawing Sheets

OTHER PUBLICATIONS

Lee, A.S.W., et al., "Enhanced Bandgap Blue-Shift in InGaAsP Multiple-quantum-well Laser Structures by Low-Temperature-Grown InP", Semiconductor Science and Technology, Institute of Physics, London, GB, vol. 15, No. 12, Dec. 2000, pp. L41-L43.

Skogen E. J. et al., "Tunable Buried Ridge Stripe Sampled Grating Distributed Bragg Reflector Lasers Utilizing Quantum Well Intermixing", LEOS 2001, 14th Annual Meeting of the IEEE Lasers & Electro-Optics Society, San Diego, CA, Nov. 11-15, 2001, vol. 1 of 2, pp. 169-170.

S. L. Ng et al., "Fabrication of Band-gap Tuned Lasers in GaAs/AlGaAs Structure using One-step Rapid Thermal Process", J. of Optical Communications, vol. 22, No. 5, 2001 pp. 162-165.

* cited by examiner

SIMS analysis of Zn profile in p+ cap and cladding layers in MOCVD material

SIMS analysis of Si profile in p+ cap and cladding layers in an MOCVD wafer (1). Laser sample is thermally annealed. Ga migrates into the sputtered SiO₂ areas.

(2). Remove SiO₂.

(3). Etch sacraficial layer to remove damaged surface (4). Etch off each stop to reveal high quality laser structure to enable metal contacts to be deposited.

CONTROL OF CONTACT RESISTANCE IN QUANTUM WELL INTERMIXED DEVICES

The present invention relates to the manufacture of photonic devices having quantum well structures, and to the quantum well intermixing (QWI) processes used to controllably vary the bandgap in the quantum well in predetermined regions of the quantum well structures.

With reference to FIG. 1, a conventional semiconductor photonic device 1 with a quantum well structure is formed on a suitable substrate 2, eg. an n-type GaAs wafer. The quantum well structure further comprises a first cladding layer 3, an optically active layer 4 in which carrier injection may be used to create photons or to modulate photon behaviour, a second cladding layer 5 and a cap layer 6.

Typically, the substrate 2 is n-type doped to a first concentration, while the first cladding layer 3 is n-type doped to a second concentration. Further, the optically active layer 4 is typically substantially intrinsic, while the second cladding layer 5 is typically p-type doped to a third concentration. Further, the cap layer 6 is p-type doped to a fourth concentration.

It will be appreciated by those skilled in the art that the cap layer 6 and second cladding layer 5 may be etched into a ridge (not shown), the ridge acting as an optical waveguide to confine optical modes within the optically active layer 4. Further, contact metallisations (not shown) may be formed on at least a portion of the top surface 8 of the device 1 to provide an electrical current injection path.

In certain areas or regions of the device 1, eg. that indicated by area 10, it may be desirable to effect a locally shifted bandgap, ie. to locally increase the bandgap energy of the quantum well structure, in order to form a variety of possible useful structures in the fabricated device.

In conventional quantum well intermixing processes, this bandgap shift is effected by exchange of atoms within the quantum well structure (eg. in the cap layer 6) with atoms from an adjacent layer or barrier material. This atom exchange occurs by interaction of the atoms with point defects in the materials and under high temperatures.

The point defects can be interstitial positions—where an atom may diffuse from one interstitial site to another through the crystal lattice structure, or vacancies, where the lattice structure has an empty site for the diffusing atom.

Impurities, such as silicon (as an n-type dopant) and zinc (as a p-type dopant) generally increase the availability of point defects (vacancies or interstitials) and thereby reduce the temperature at which QWI takes place. In addition, implantation and other crystal lattice damage-inducing processes can locally increase the availability of point defects and thereby reduce the temperature at which QWI takes place.

In a further technique, the provision of a dielectric cap layer 12, such as silica, on the surface of the semiconductor quantum well structure, followed by a high temperature anneal, creates vacancies in the cap layer 6 which then diffuse through the semiconductor structure.

The effect of quantum well intermixing is to increase the band-gap of the semiconductor quantum well structure in a controllable manner. As shown in FIG. 2, the conduction band 20 and valance band 21 structures of a GaAs quantum well with AlAs barriers is shown both before QWI (line 22) and after QWI (line 23). This effect has considerable utility in the fabrication of a wide range of photonic devices.

For example, a GaAs quantum well with AlGaAs barriers may be quantum well intermixed to give rise to a parabolic well 23 that is 'blue-shifted' with respect to the unshifted quantum well. QWI techniques can be used to improve the performance of individual devices, for example, create non-absorbing mirrors on laser facets to reduce catastrophic optical damage.

Although there are considerable advantages in the use of QWI for the manufacture of photonic devices, the high temperature processing and other crystal lattice disruption generally caused by any or all of the above described QWI techniques can lead to any or all of the following undesirable side effects: (a) damage to surface 8, (b) dopant impurity segregation (c) impurity diffusion from a dielectric cap layer 6 into the other layers of the semiconductor.

Thus after the QWI process, deposition of a metal contact on top of a QWI processed layer can give rise to a high resistance contact, giving impaired device performance.

Generally, one, or a combination, of the effects described above can contribute to a high p-type contact resistance, high turn-on voltage and soft I-V characteristics in a fabricated device. A high turn-on voltage will introduce more undesirable heat into the device, limit the output power and reduce device lifetime.

It is an object of the present invention to provide a process for manufacture of photonic devices, using quantum well intermixing techniques, that eliminates, mitigates or at least reduces the problems associated with poor contact performance arising from any or all of the QWI processes described above.

It is a further object of the present invention to provide a process for improving the contact resistance of a device manufactured using QWI techniques.

According to one aspect, the present invention provides a method of performing quantum well intermixing in a semiconductor device structure, comprising the steps of:
a) forming a layered quantum well structure including a doped cap layer;
b) forming an etch stop layer over said cap layer;
c) forming a sacrificial layer over said etch stop layer, said etch stop layer having a substantially lower etch rate than said sacrificial layer when exposed to predetermined etch conditions;
d) carrying out a quantum well intermixing process on the device structure, which process induces significant damage to at least a portion of the sacrificial layer;
e) removing the sacrificial layer in at least a contact region of the device using an etch procedure selective against the etch stop layer to expose said etch stop layer in a contact region; and
f) forming a contact over the layered quantum well structure in at least said contact region.

Embodiments of the present invention will now be described by way of example and with reference to the accompanying drawings in which.

Figure 1:
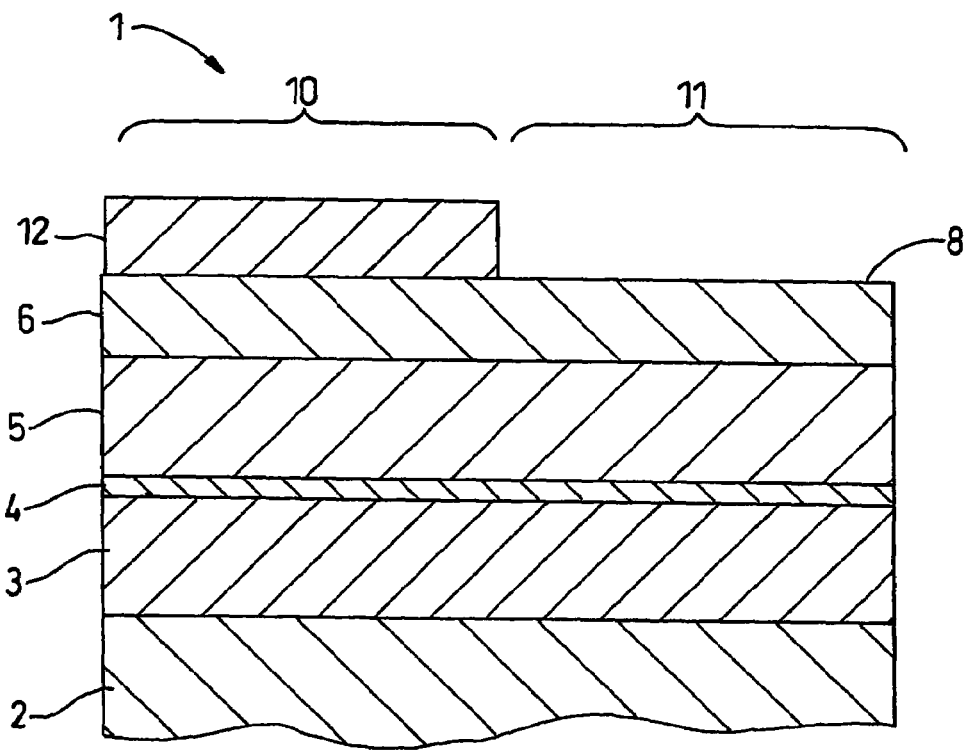
FIG. 1 is a schematic cross-sectional diagram of a quantum well structure for a photonic device suitable for application of quantum well intermixing processes.
Figure 2:
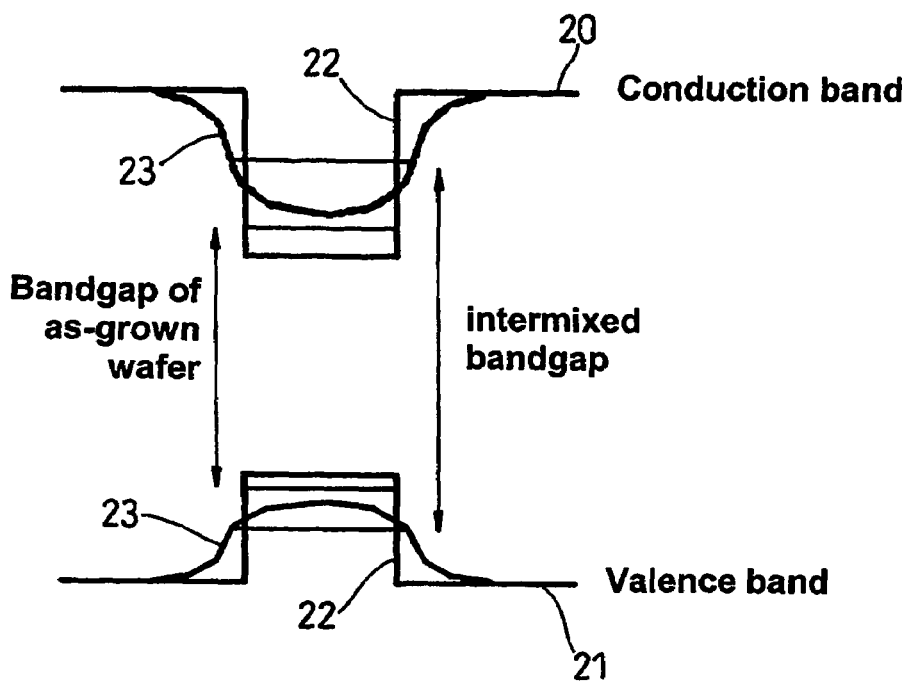
FIG. 2 is a diagram showing the effects of quantum well intermixing on the bandgap in a quantum well structure as depicted in FIG. 1.

According to the present invention, it has been recognised that the provision of a sacrificial part of the cap layer, that is removed after QWI processing, confers considerable advantages in restoring the cap surface to a condition in which high performance contacts are still possible. To this end, the invention provides an etch-stop layer and a sacrificial cap layer on top of the conventional cap layer 6 of FIG. 1, such that the damaged and impurity depleted material arising from the QWI processing can be removed easily and allow a low resistance p-type contact to be deposited on the QWI structure. This substantially improves the device performance by increasing the output power and lifetime.

Figure 3:
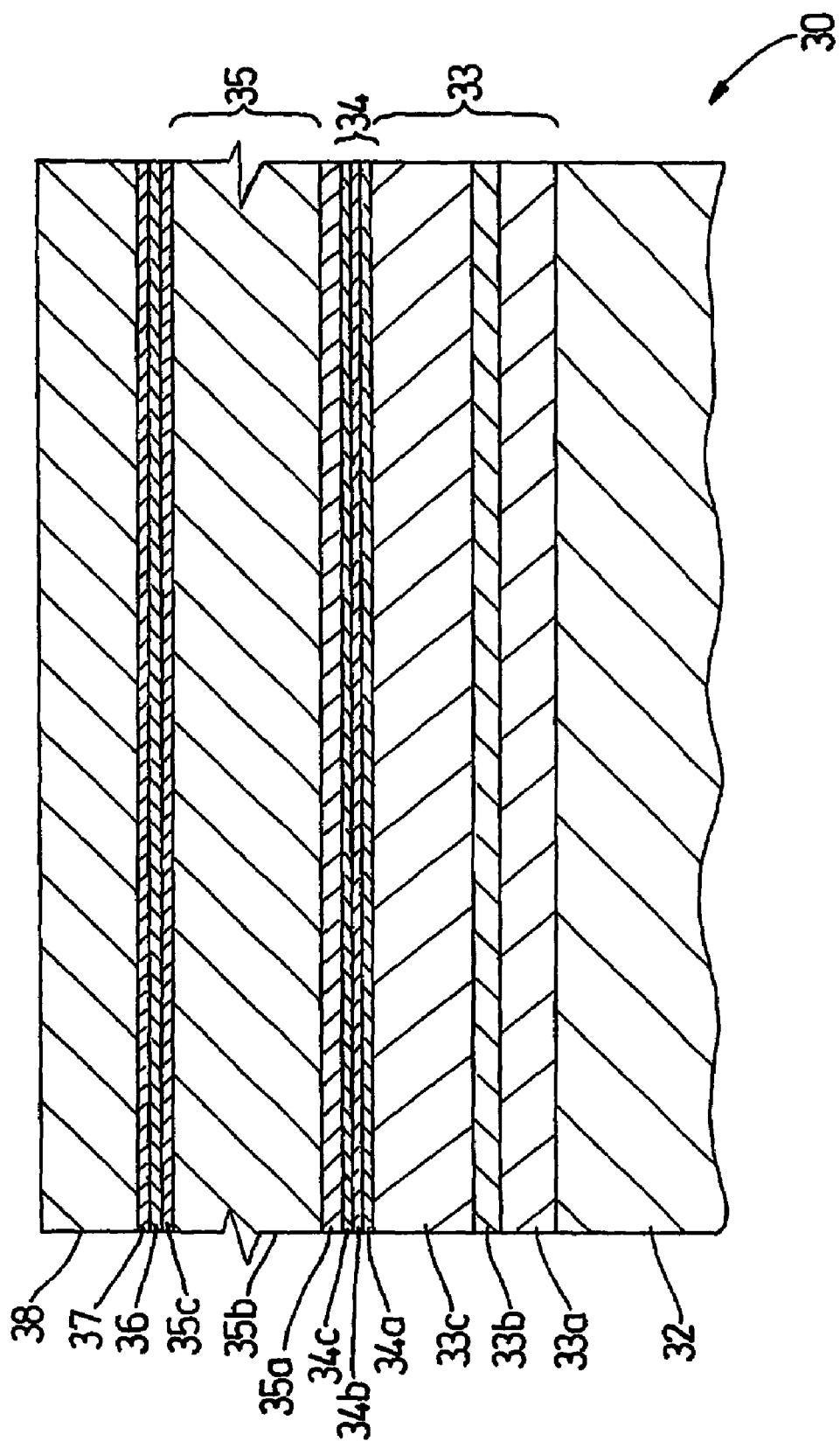
FIG. 3 is a schematic cross-sectional diagram of a semiconductor quantum well structure according to one aspect of the present invention.

A preferred embodiment of the fabricated quantum well structure, etch stop layer and sacrificial cap layer, prior to application of a quantum well intermixing process, is shown in FIG. 3.

The device structure 30 comprises an n-type substrate 32 (eg. a GaAs wafer) onto which the semiconductor layers 33–36 are fabricated. A first cladding layer 33 is formed thereon. Preferably, the first cladding layer is an n-type material, eg. silicon-doped AlGaAs. More preferably, the first cladding layer may comprise plural sub-layers, eg. first, second and third sub-layers 33a, 33b and 33c.

An optically active layer 34 is formed on the first cladding layer. Preferably the optically active layer is an intrinsic, undoped material. More preferably, the optically active layer 34 may comprise plural sub-layers, eg. first, second and third sub-layers 34a, 34b and 34c.

A second cladding layer 35 is formed thereon. Preferably, the second cladding layer is a p-type material, eg. zinc-doped AlGaAs. More preferably, the second cladding layer may comprise plural sub-layers, eg. first, second and third sub-layers 35a, 35b and 35c.

A cap layer 36 is formed on top of the second cladding layer 35 to enable current injection into the device. Preferably, the cap layer 36 is a p-type material, eg. zinc-doped GaAs. The cap layer 36 will be retained after the QWI process. Preferably, the cap layer is free of aluminium to prevent oxidation of the layer upon exposure to air.

In accordance with the present invention, overlying the cap layer 36 is an etch stop layer 37. The etch stop layer 37 preferably comprises a p-type material of similar doping levels to the cap layer. Overlying the etch stop layer is a sacrificial layer 38. The sacrificial layer preferably comprises a p-type material of similar doping levels to the cap layer. More preferably, the sacrificial layer comprises the same material as the cap layer.

In general, the etch stop layer 37 has similar electrical properties to the cap layer 36 and the sacrificial layer, but provides a substantially increased resistance to etching, either by wet chemical, gaseous, or plasma etching techniques, than the sacrificial layer.

Preferably, the device structure described above is formed using epitaxial growth techniques, such as molecular beam epitaxy (MBE) or metallo-organic chemical vapour deposition (MOCVD). However, any suitable growth or deposition technique, such as vapour phase epitaxy (VPE) or liquid phase epitaxy (LPE), may be used.

An exemplary semiconductor laser, having a 980 nm wavelength output, and manufactured using the preferred structure described above would typically consist of the layers as defined in Table 1 below.

In the example of Table 1, the etch stop layer is formed from GaInP.

In a further exemplary embodiment, the etch stop layer is formed from AlAs. A preferred structure for this embodiment is defined in Table 2 below.

TABLE 1

| Layer | Material | Mole Fraction (start) | Fraction (finish) | Strain % | PL (nm) | Thcknss (μm) | CV (start) | Level (finish) | type | Dopant |
|---|---|---|---|---|---|---|---|---|---|---|
| 38 | GaAs | | | | | 1 | >2e19 | | p | Zn |
| 37 | Ga(x)InP | 0.5 | | 0 | | 0.05 | >2e19 | | p | Zn |
| 36 | GaAs | | | | | 0.1 | >2e19 | | p | Zn |
| 35c | Al(x)GaAs | 0.32 | 0.0 | | | 0.12 | 2e18 | | p | Zn |
| 35b | Al(x)GaAs | 0.32 | | | | 1.7 | 2e18 | | p | Zn |
| 35a | Al(x)GaAs | 0.32 | | | | 0.2 | 2e17 | 2e18 | p | Zn |
| 34c | Al(x)GaAs | 0.1 | 0.32 | | | 0.11 | | | i | |
| 34b | GaIn(x)As | 0.17 | | 1.19 | 970 nm | 0.008 | | | i | |
| 34a | Al(x)GaAs | 0.32 | 0.1 | | | 0.11 | | | i | |
| 33c | Al(x)GaAs | 0.32 | | | | 1 | 2e18 | | n | Si |
| 33b | Al(x)GaAs | 0 | 0.32 | | | 0.25 | 2e18 | | n | Si |
| 33a | GaAs | | | | | 0.5 | 2e18 | | n | Si |

TABLE 2

| Layer | Material | Mole Fraction (start) | Fraction (finish) | Strain % | PL (nm) | Thcknss (μm) | CV (start) | Level (finish) | type | Dopan |
|---|---|---|---|---|---|---|---|---|---|---|
| 38 | GaAs | | | | | 1 | >2e19 | | p | Zn |
| 37 | AlAs | | | | | 0.01 | >2e19 | | p | Zn |
| 36 | GaAs | | | | | 0.1 | >2e19 | | p | Zn |
| 35c | Al(x)GaAs | 0.32 | 0.0 | | | 0.12 | 2e18 | | p | Zn |
| 35b | Al(x)GaAs | 0.32 | | | | 1.7 | 2e18 | | p | Zn |
| 35a | Al(x)GaAs | 0.32 | | | | 0.2 | 2e17 | 2e18 | p | Zn |
| 34c | Al(x)GaAs | 0.1 | 0.32 | | | 0.11 | | | i | |
| 34b | GaIn(x)As | 0.17 | | 1.19 | 970 nm | 0.008 | | | i | |
| 34a | Al(x)GaAs | 0.32 | 0.1 | | | 0.11 | | | i | |
| 33c | Al(x)GaAs | 0.32 | | | | 1 | 2e18 | | n | Si |

TABLE 2-continued

| Layer | Material | Mole Fraction (start) | Fraction (finish) | Strain % | PL (nm) | Thcknss (μm) | CV (start) | Level (finish) | type | Dopan |
|---|---|---|---|---|---|---|---|---|---|---|
| 33b | Al(x)GaAs | 0 | 0.32 | | | 0.25 | 2e18 | | n | Si |
| 33a | GaAs | | | | | 0.5 | 2e18 | | n | Si |

The QWI process is carried out on the structure as described above. In a preferred QWI procedure, a layer of silica is deposited on top of the semiconductor followed by a thermal anneal process.

After the QWI process and removal of the silica, significant degradation of the topmost layer 38 of the structure is found. It will be understood that in a conventional process, the topmost layer would essentially comprise the cap layer 36. This degradation may significantly compromise the performance of any contact formed by deposition of a suitable metallisation layer on the cap layer 36.

The degradation takes the form of: (a) physical damage to the semiconductor surface; (b) diffusion of the p-type impurity dopant (in the example, Zn) away from the surface; and (c) impurity contamination moving from the silica into the semiconductor layer.

With respect to (a), surface damage after QWI can be observed with an optical microscope.

Figure 4:
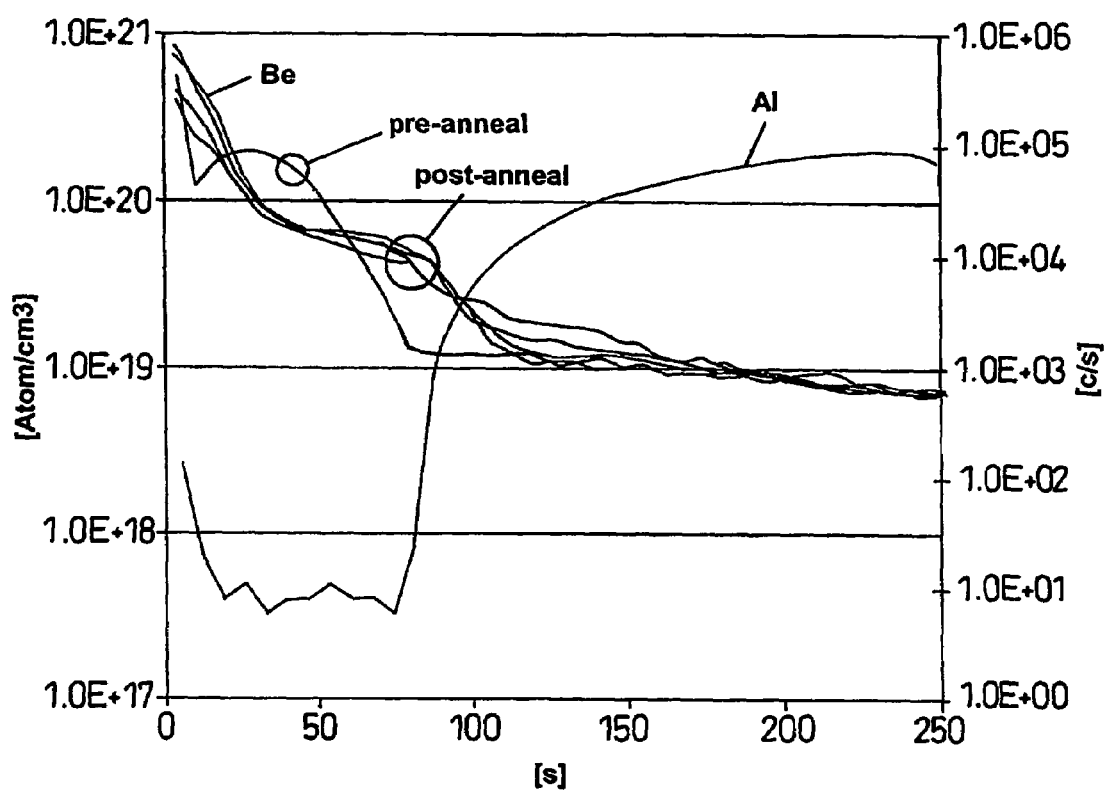
FIG. 4 shows the results of a SIMS analysis of the beryllium doping profile in p+ cap and cladding layers of molecular beam epitaxy grown semiconductor material.
Figure 5:
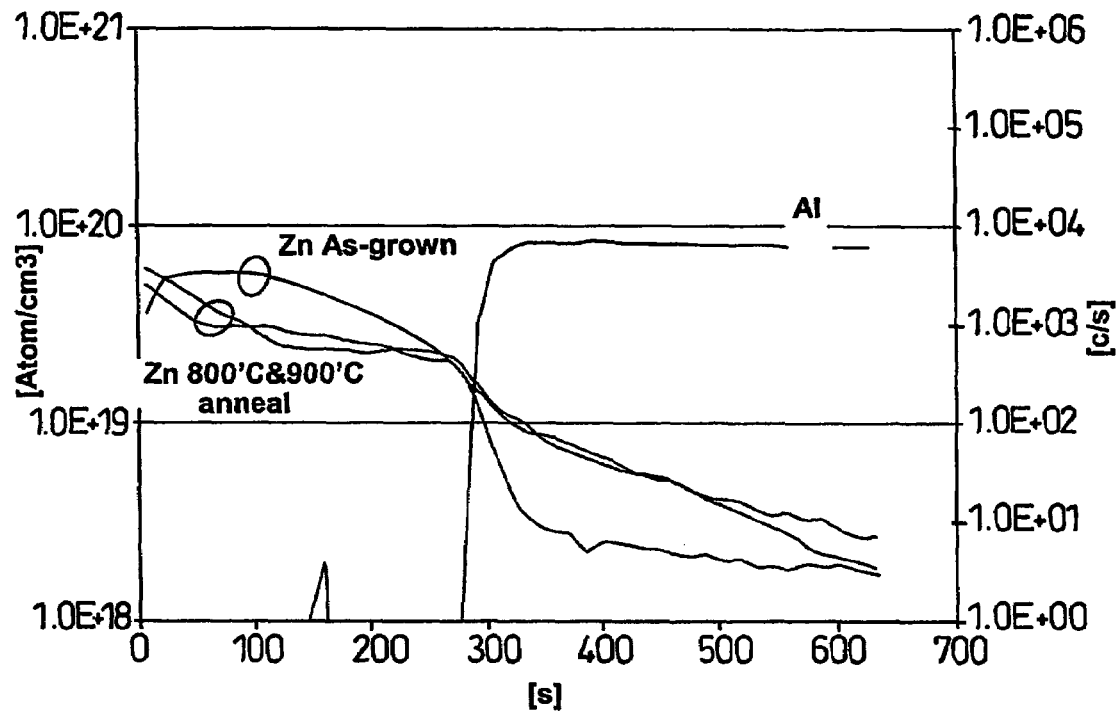
FIG. 5 shows the results of a SIMS analysis of the zinc doping profile in p+ cap and cladding layers of MOCVD grown material.

With respect to (b), p-type impurity dopant diffusion can be seen in SIMS measurements of the device structure pre- and post-anneal. FIGS. 4 and 5 are SIMS measurements showing the p-type profile. FIG. 4 shows the profile for MBE-grown material (in this example, doped with Beryllium) both before and after the anneal process. FIG. 5 shows the profile for MOCVD-grown material (doped with zinc) both before and after the anneal process. The dopant concentration is shown as a function of depth, indicated on the horizontal axes as etch time in seconds. It can be seen in both of these measurements that the p-type impurity concentration has dropped by a factor of ~2 resulting in a corresponding increase in the resistivity of the material.

Figure 6:
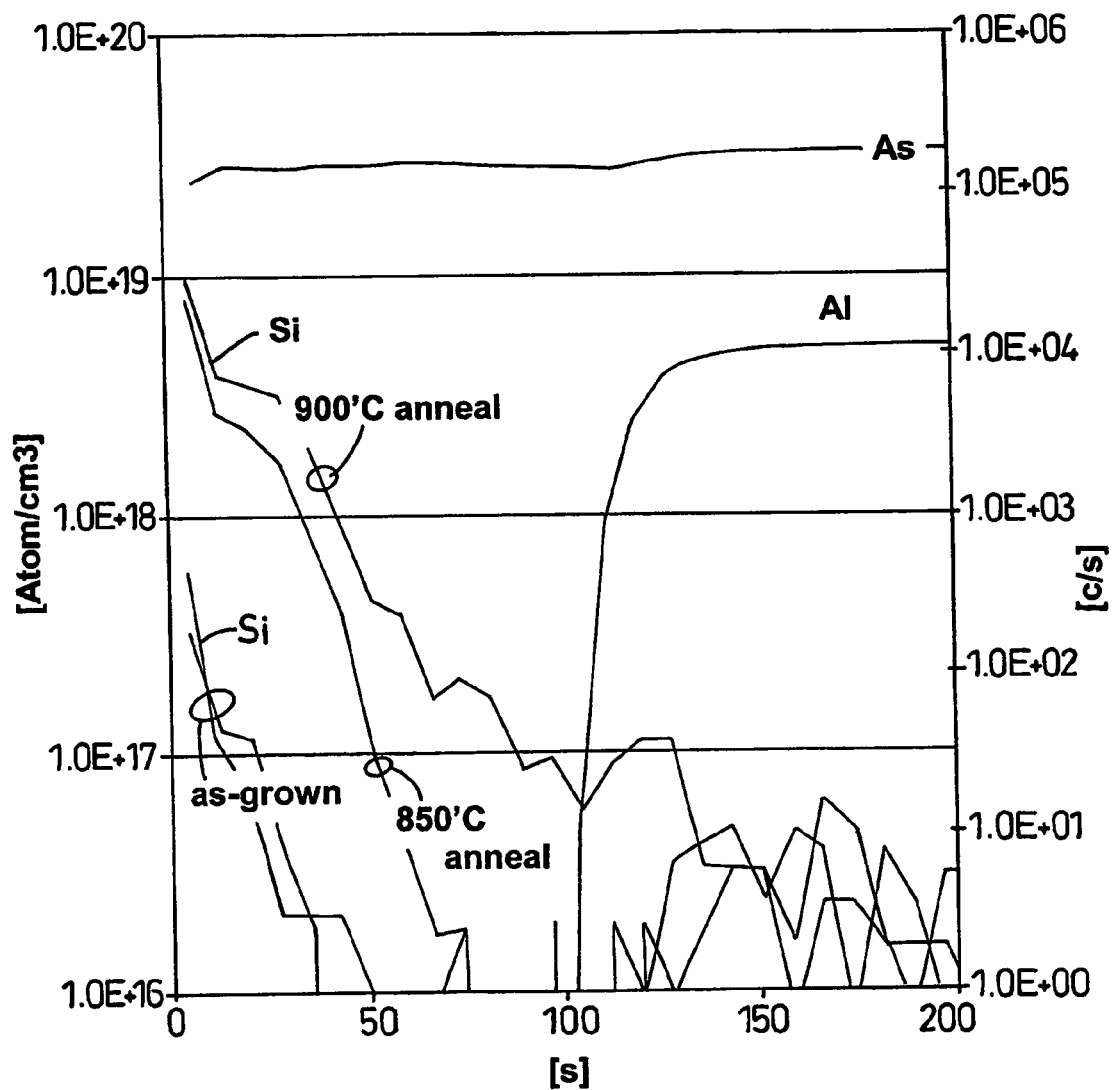
FIG. 6 shows the results of a SIMS analysis of the silicon profile in p+ cap and cladding layers in MOCVD grown material.

With respect to (c), FIG. 6 shows SIMS measurements for as-grown silicon compared with post-annealed samples (850° C. and 900° C. anneals) and shows that a high level of silicon impurities have diffused into the semiconductor material after the QWI process.

Referring back to FIG. 3, in the present invention, a selective etch (wet or dry) is used to remove the damaged epitaxial material, i.e. sacrificial layer 38. The etch process is selected to be highly selective for the sacrificial layer 38 and against the material of the etch-stop layer 37 using techniques established in the art.

Thus, the selective etch process terminates at the etch stop layer 37. A number of good selective wet and dry etches that distinguish well between arsenide layers and phosphide layers are known the person skilled in the art.

A metal contact can then be deposited directly onto the etch stop layer, if the etch stop material is suitable for a low resistance contact.

Alternatively, a second selective etch, selective for the etch stop layer and against the cap layer 36, can be used to remove the etch stop layer, revealing a high quality cap layer 36 semiconductor surface with the required p-type doping levels, and the metal contact can be deposited thereon.

It will be understood that the first and/or second selective etches need only be carried out in regions where contacts are to be formed. In other regions of the device, the sacrificial layer and/or etch stop layer may be left.

With a conventional QWI process, without the use of a sacrificial layer 38 and etch stop layer 37, contact resistances of p-type contacts formed on the cap 36 typically show a rise from approximately 2 ohms to greater than 5 ohms, and an increase in turn-on voltage from approximately 1.2 V to greater than 2 V in a 980 nm semiconductor laser.

The exemplary embodiments described above have demonstrated a contact resistance and turn-on voltage for a 980 nm laser substantially unaffected by the QWI process.

It is therefore possible to provide the benefits of the QWI process in the formation of bandgap shifted regions of the device (eg. for forming non-absorbing mirrors in a laser device, without the drawbacks of higher contact resistance and turn-on voltage.

The examples given above describe an AlGaAs 980 nm laser. However, the invention may also be applied to any arsenide, phosphide, nitride or antimonide-based III-V photonic device that requires quantum well intermixing regions and electrical contacts.

The invention has a principal use in the manufacture of semiconductor lasers and amplifiers for telecommunication applications but can be applied generally to manufacture of any devices requiring QWI techniques.

The use of a combined sacrificial layer 38 and etch stop layer 37 offers a considerable number of advantages over the prior art.

Defects in the layers that are induced by the quantum well intermixing processes can run deep into the sacrificial layer, and the etch stop layer assists in preventing such defects moving into the cap layer.

The use of an etch stop layer is also found to provide a good, atomically flat surface after etch that substantially improves contact resistance after metal deposition. By contrast, a simple timed etch on a thick sacrificial layer plus cap layer yields a rough surface (particularly in view of the variability in etch rate induced by the damaged upper regions of the sacrificial layer), which rough surface introduces contact formation problems.

In addition, the power and optical spectra of a ridge waveguide laser are critically determined by the ridge width and height. Wet or dry etching a thick cap plus sacrificial layer to obtain a precise ridge height is difficult to achieve and undesirable in a robust manufacturing process. The etch stop layer determines the height of the ridge with very good (atomic) precision.

The use of an etch stop layer may also enables a general reduction in the thickness of the cap layer, thus enabling the use of less severe QWI process conditions to obtain the required degree of intermixing, and hence reducing further the damage introduced to the semiconductor structure.

FIGS. 7 to 10 illustrate use of the etch stop and sacrificial layers described above in the context of a QWI process used in the formation of a semiconductor laser.

Figure 7:
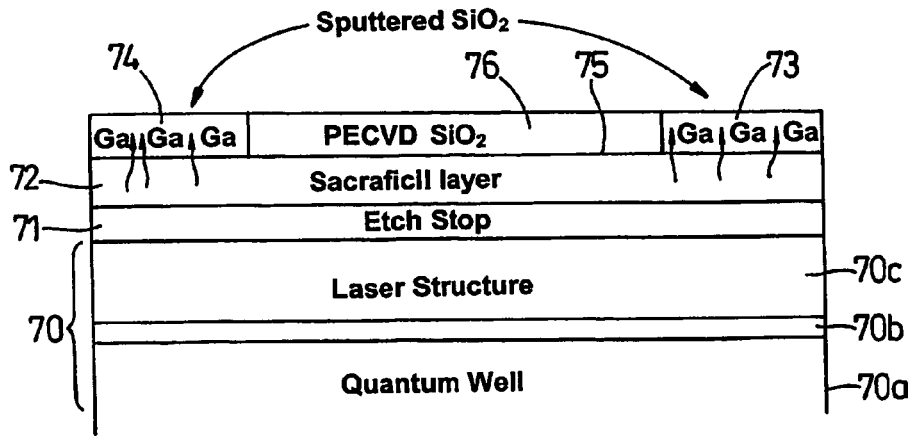

With reference to FIG. 7, a conventional laser device structure 70 comprising cladding layers 70a and 70c together with intrinsic optically active layer 70*b* are formed on a substrate (not shown) to define a quantum well. Each of these layers may comprise further sub-layers as previously described.

In order to perform a quantum well intermixing process to define further features of the optical device, an etch stop layer 71 and sacrificial layer are formed thereon as described previously. To effect the QWI process, a silicon dioxide layer is sputtered onto predefined regions 73, 74. A suitable photolithographically defined mask material such as photoresist (not shown) protects other regions 75 of the surface during the sputter deposition. After removal of the protective photoresist layer from surface 75, a PECVD silicon oxide 76 is deposited, essentially coating the surface 75.

The device is then thermally annealed, preferably using a rapid thermal annealing (RTA) process in accordance with known techniques. During this RTA process, Gallium from the underlying laser structure 70 migrates into the sputtered $SiO_2$ layers 73, 74 thereby forming bandgap shifted regions of the quantum well underneath the sputtered $SiO_2$ layers 73, 74. The PECVD $SiO_2$ inhibits the quantum well intermixing process.

Figure 8:
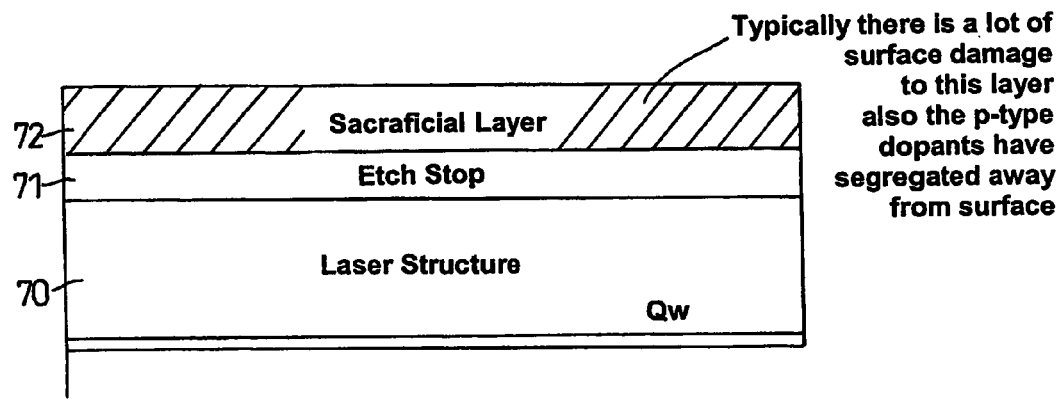
Figure 9:
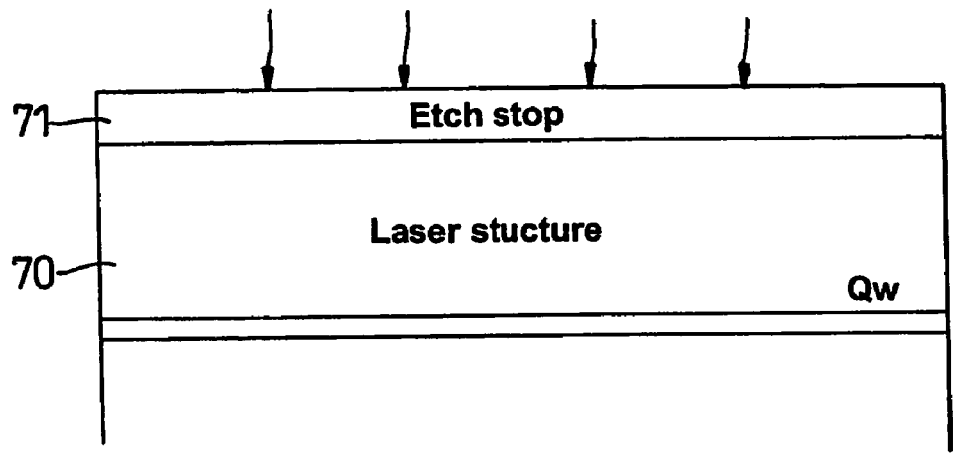

In FIG. 8, the $SiO_2$ layers have been removed. There is significant damage to the exposed surface of the sacrificial layer and p-type dopants have segregated away from the surface. With reference to FIG. 9, the sacrificial layer is removed by an etching process selective against the etch stop layer 71 as previously described.

Figure 10:
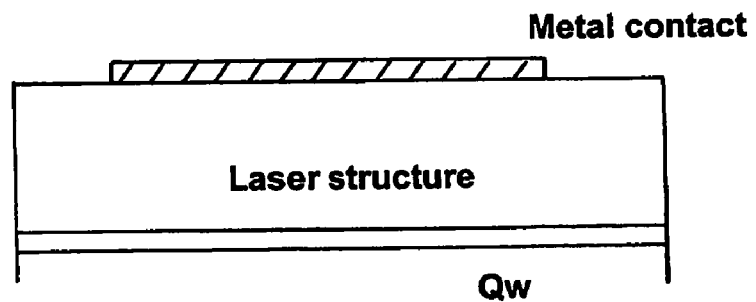

As shown in FIG. 10, the etch stop layer is then removed with a suitable etch process leaving a high quality surface to the laser structure 70 upon which may be deposited a suitable metal contact.

Other embodiments are within the scope of the accompanying claims.

The invention claimed is:

1. A method of performing quantum well intermixing in a semiconductor device structure, comprising the steps of:
   a) forming a layered quantum well structure including a doped cap layer;
   b) forming an etch stop layer over said cap layer;
   c) forming a sacrificial layer over said etch stop layer, said etch stop layer having a substantially lower etch rate than said sacrificial layer when exposed to predetermined etch conditions;
   d) carrying out a quantum well intermixing process on the device structure, which process induces significant damage to at least a portion of the sacrificial layer;
   e) removing at least the sacrificial layer in at least a contact region of the device using an etch procedure selective against the etch stop layer to expose said etch stop layer in the contact region; and
   f) forming a contact, over the patterned quantum well structure and directly on the surface exposed by the removal of step e), in at least said contact region.

2. The method of claim 1 in which step e) further includes the step of removing the etch stop layer using an etch procedure selective against the doped cap layer to expose said doped cap layer at least in said contact region.

3. The method of claim 2 wherein step f) includes the step of depositing a metal layer onto said doped cap layer to form said contact.

4. The method of claim 1 in which step d) comprises a heat treatment step.

5. The method of claim 1 in which step d) comprises an impurity-free vacancy disordering technique that includes the step of forming a dielectric layer on top of at least a portion of the sacrificial layer during the quantum well intermixing process.

6. The method of claim 1 wherein step f) includes the step of depositing a metal layer onto said etch stop layer to form said contact.

7. The method of claim 1 in which the sacrificial layer has one or more of similar doping levels, similar electrical properties and/or similar diffusion coefficients to the doped cap layer.

8. The method of claim 7 in which the sacrificial layer is formed from the same semiconducting material as the doped cap layer.

9. The method of claim 1 in which the layered quantum well structure comprises a substrate of a first doping level and first dopant type, a first cladding layer of a second doping level and of the first dopant type as the substrate; an optically active layer of substantially intrinsic type; a second cladding layer of a third doping level and a second dopant type; and a cap layer of a fourth doping level and second dopant type.

10. The method of claim 9 in which the first dopant type is n-type and the second dopant type is p-type.

11. The method of claim 9 in which at least one of said first cladding layer, optically active layer and second cladding layer is formed from a plurality of different sub-layers.

12. The method of claim 1 in which the doped cap layer comprises GaAs, the etch stop layer comprises GaInP and the sacrificial layer comprises GaAs.

13. The method of claim 1 in which the doped cap layer comprises GaAs, the etch stop layer comprises AlAs and the sacrificial layer comprises GaAs.

14. The method of claim 1 further including the step of forming a photonic device from said semiconductor device structure.

* * * * *